United States Patent
Igari et al.

(10) Patent No.: US 9,814,147 B2
(45) Date of Patent: Nov. 7, 2017

(54) ELECTRONIC CIRCUIT UNIT

(71) Applicant: ALPINE ELECTRONICS, INC., Shinagawa-ku, Tokyo (JP)

(72) Inventors: Yasuyuki Igari, Iwaki (JP); Shinobu Kida, Iwaki (JP); Tatsuya Watanabe, Iwaki (JP); Takao Okabe, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 122 days.

(21) Appl. No.: 14/808,576

(22) Filed: Jul. 24, 2015

(65) Prior Publication Data

US 2016/0044799 A1  Feb. 11, 2016

(30) Foreign Application Priority Data

Aug. 6, 2014  (JP) ................................ 2014-160332

(51) Int. Cl.
*H05K 5/00* (2006.01)
*H01R 12/72* (2011.01)

(52) U.S. Cl.
CPC .......... *H05K 5/006* (2013.01); *H05K 5/0052* (2013.01); *H05K 5/0069* (2013.01); *H01R 12/724* (2013.01)

(58) Field of Classification Search
None
See application file for complete search history.

(56) References Cited

U.S. PATENT DOCUMENTS

| | | | | |
|---|---|---|---|---|
| 4,850,884 A * | 7/1989 | Sawai | ................ | B60R 16/0239 361/752 |
| 5,144,533 A * | 9/1992 | Annett | ................ | H05K 5/0013 312/223.1 |
| 5,284,359 A * | 2/1994 | Baba | ..................... | B60R 21/217 280/728.1 |
| 5,475,566 A * | 12/1995 | Rada | .................... | H05K 5/0013 361/736 |
| 5,577,768 A * | 11/1996 | Taguchi | ............. | B60R 21/2035 280/728.2 |
| 6,094,349 A * | 7/2000 | Fassel | .................... | H05K 3/284 165/80.2 |
| 6,217,377 B1 * | 4/2001 | Nishizawa | .......... | B60R 16/0238 439/553 |
| 6,313,400 B1 * | 11/2001 | Mosquera | ............. | H05K 5/026 174/363 |
| 6,628,523 B2 * | 9/2003 | Kobayashi | ........... | H05K 5/0047 361/736 |
| 6,707,678 B2 * | 3/2004 | Kobayashi | ............. | H05K 5/062 361/752 |

(Continued)

FOREIGN PATENT DOCUMENTS

JP  A1 2002-314264  10/2002

*Primary Examiner* — Courtney Smith
*Assistant Examiner* — Rashen E Morrison
(74) *Attorney, Agent, or Firm* — Brinks Gilson & Lione

(57) ABSTRACT

A housing includes a first chassis and a second chassis which are each formed of a metal sheet. Support projections integrally formed with support pieces formed in the first chassis are fitted into support holes of a circuit board on both left and right sides of a connector. A lower surface of the circuit board is supported by receiving portions formed in the support pieces, and part of the circuit board facing the connector is pressed downward by a pressing projection formed in the second chassis.

20 Claims, 8 Drawing Sheets

(56) References Cited

U.S. PATENT DOCUMENTS

| | | | | |
|---|---|---|---|---|
| 6,717,051 B2* | 4/2004 | Kobayashi | B60R 16/0239 | 174/535 |
| 6,894,891 B2* | 5/2005 | Darr | H05K 7/142 | 361/601 |
| 7,140,885 B2* | 11/2006 | Kitamura | H05K 5/0039 | 361/752 |
| 7,190,589 B2* | 3/2007 | Caines | H05K 5/061 | 174/16.1 |
| 7,413,463 B2* | 8/2008 | Matsuo | H05K 5/0039 | 439/377 |
| 7,417,868 B2* | 8/2008 | Morisada | H05K 7/1405 | 361/741 |
| 7,563,992 B2* | 7/2009 | Lawlyes | H05K 9/0073 | 174/561 |
| 7,699,622 B2* | 4/2010 | Sakamoto | H01R 13/629 | 439/76.1 |
| 7,813,134 B2* | 10/2010 | Katsuro | H05K 7/20454 | 165/104.33 |
| 8,184,438 B2* | 5/2012 | Kaneko | H05K 7/026 | 165/80.2 |
| 8,408,945 B2* | 4/2013 | Schober | H05K 5/0039 | 439/660 |
| 8,531,845 B2* | 9/2013 | Chen | H05K 5/0208 | 361/752 |
| 8,917,519 B2* | 12/2014 | Sano | H05K 5/0221 | 206/706 |
| 8,933,349 B2* | 1/2015 | Takahashi | H05K 5/0013 | 174/561 |
| 8,942,001 B2* | 1/2015 | Kawai | H05K 5/0052 | 174/50.5 |
| 9,013,889 B2* | 4/2015 | Tamura | H05K 5/0052 | 361/752 |
| 9,093,776 B2* | 7/2015 | Yamanaka | H05K 5/0069 | |
| 9,293,870 B1* | 3/2016 | Koczwara | H01R 12/724 | |
| 9,313,936 B2* | 4/2016 | Seok | H05K 13/0023 | |
| 2004/0212974 A1* | 10/2004 | Ice | G02B 6/4277 | 361/801 |
| 2008/0074840 A1* | 3/2008 | Suzuki | H05K 5/0047 | 361/679.46 |
| 2009/0068862 A1* | 3/2009 | Honda | H05K 5/0052 | 439/78 |
| 2009/0103267 A1* | 4/2009 | Wieland | H05K 7/20409 | 361/707 |
| 2011/0013370 A1* | 1/2011 | Oota | H01L 23/42 | 361/752 |
| 2011/0228498 A1* | 9/2011 | Kawai | H05K 7/20854 | 361/752 |
| 2012/0190252 A1* | 7/2012 | Pavlinsky | H01M 10/425 | 439/775 |
| 2013/0058044 A1* | 3/2013 | Watanabe | H05K 5/006 | 361/714 |
| 2013/0058059 A1* | 3/2013 | Min | H05K 9/0026 | 361/756 |
| 2013/0120943 A1* | 5/2013 | Tamura | H05K 5/0052 | 361/752 |
| 2013/0250521 A1* | 9/2013 | Kawai | H05K 7/20854 | 361/714 |
| 2013/0286606 A1* | 10/2013 | Watanabe | H05K 7/1417 | 361/752 |
| 2014/0065877 A1* | 3/2014 | Ohhashi | H05K 5/0052 | 439/519 |
| 2014/0085839 A1* | 3/2014 | Nakano | H05K 5/0052 | 361/752 |
| 2014/0334115 A1* | 11/2014 | Yang | H05K 5/06 | 361/752 |
| 2014/0334116 A1* | 11/2014 | Lee | H05K 5/0052 | 361/752 |
| 2014/0362533 A1* | 12/2014 | Shin | H05K 7/2039 | 361/707 |
| 2015/0022976 A1* | 1/2015 | Ott | H01L 23/057 | 361/736 |
| 2015/0146347 A1* | 5/2015 | Lee | H01R 13/5202 | 361/679.01 |
| 2015/0250072 A1* | 9/2015 | Ichikawa | H05K 5/063 | 439/587 |

* cited by examiner

ELECTRONIC CIRCUIT UNIT

RELATED APPLICATION

The present application claims priority to Japanese Patent Application Number 2014-160332, filed Aug. 6, 2014, the entirety of which is hereby incorporated by reference.

BACKGROUND

1. Field of the Invention

The present invention relates to an electronic circuit unit that includes a metal housing and a circuit board which is housed in the housing and to which a connector is secured.

2. Description of the Related Art

Japanese Unexamined Patent Application Publication No. 2002-314264 describes an invention relating to a casing that houses an electronic component. This casing includes a casing body that includes an upper casing body and a lower casing body which are formed of metal. A printed circuit board to which a connector is secured is housed in the casing body.

An upwardly extending elastic engagement piece is formed in the lower casing body. The engagement piece is brought into engagement with a recess portion formed in the printed circuit board. When the upper casing body is combined with the lower casing body, the elastic engagement piece is swaged and secured to the upper casing body and an edge portion of the printed circuit board is pinched between a pressing portion of the upper casing body and the lower casing body.

In a casing that houses a printed circuit board to which a connector is secured, a large force acts on the connector when a plug is fitted into or removed from the connector. This force is transmitted from the connector to the printed circuit board. Thus, by repeatedly fitting and removing the plug into and from the connector, a problem in that a conductive pattern and soldered portions formed on the printed circuit board are damaged or is likely to occur.

With the casing described in Japanese Unexamined Patent Application Publication No. 2002-314264, part of the printed circuit board is only pinched between the lower casing body and the upper casing body. Thus, when a large force is repeatedly applied to the connector, large stress is likely to act on the printed circuit board.

Furthermore, since the mass of a connector secured to the circuit board is comparatively large, the circuit board is likely to be moved in the casing. In the case of on-vehicle equipment, the circuit board is likely to rattle. According to the structure described in Japanese Unexamined Patent Application Publication No. 2002-314264, the printed circuit board is pinched between the upper casing body and the lower casing body. Thus, the printed circuit board is likely to be moved in the casing body.

It is conceivable to use alternative related art with which a printed circuit board is secured to a casing by screws so as to reduce the likelihood of bending stress acting on the printed circuit board. However, with this structure, the number of man-hours for screwing in assembly is increased. Furthermore, a space for screwing is required. Thus, it is difficult to reduce the size.

SUMMARY

The present disclosure seeks to address the above-described problem with the related art. The present disclosure provides an electronic circuit unit with which a circuit board can be firmly held so as to eliminate a movement of the circuit board when an external force acts on a connector and with which the circuit board can be firmly held when a plug is fitted into or removed from the connector.

According to an aspect of the present disclosure, in an electronic circuit unit that includes a housing and a circuit board which is housed in the housing and to which a connector is secured, the housing includes a first chassis and a second chassis that covers an opening of the first chassis, and the first chassis and the second chassis are each formed of a metal sheet. The first chassis has a pair of support pieces formed by inwardly bending the metal sheet that is part of a side plate portion and an opening formed between the support pieces that face each other. The support pieces have respective receiving portions and respective support projections integrally formed with the support pieces. The circuit board has support holes, the circuit board is provided inside the first chassis, the connector is inserted into the opening, the circuit board is supported by the receiving portions, and the support projections are inserted into the support holes.

The support holes may be formed in areas on both sides of the connector.

In the electronic circuit unit according to this aspect of the present disclosure, the circuit board is supported by the support pieces formed by bending the first chassis. Thus, a stress that damages the circuit board is unlikely to occur when an external force acts on the connector. In particular, by supporting the circuit board at both sides of the connector, it is unlikely that large bending stress or the like will act on the circuit board.

When a direction in which the support pieces extend is defined as a front-rear direction, both edge portions of each of the support projections in the front-rear direction may be in contact with a corresponding one of the support holes so as to position the circuit board relative to the first chassis in the front-rear direction.

Furthermore, the support projections may have respective deformed portions that project in a plate thickness direction and that are brought into contact with inner edges of the support holes so as to position the circuit board in a left-right direction that is the plate thickness direction.

By eliminating or minimizing clearances between the support projections and the support holes as described above, the circuit board can be reliably held by the support projections.

The second chassis may have a pressing projection that faces the first chassis so as to position the circuit board in an up-down direction that is a plate thickness direction of the circuit board by the receiving portions of the support pieces and the pressing projection.

In this case, the pressing projection may have a fitting projection at a tip end portion thereof, a hole may be formed in the circuit board, and the fitting projection may be fitted into the hole. Furthermore, the pressing projection may be formed at a position facing the connector.

By supporting the circuit board from above with the pressing projection formed in the second chassis as described above, the circuit board can be supported further firmly. In particular, the external force applied to the connector is unlikely to affect the circuit board when a part where the connector is secured is supported by the pressing projection.

An area of the second chassis may be larger than an area of the opening of the first chassis, a positioning projection may be formed in the side plate portion of the first chassis, a positioning hole may be formed in the second chassis, and the positioning projection may be fitted into the positioning hole so as to position the first chassis and the second chassis relative to each other.

Furthermore, the first chassis and the second chassis may be secured to each other only by projection and recess fitting.

According to this aspect of the present disclosure, parts of the circuit board further to the inside than edge portions of the circuit board are supported by the support pieces formed by bending the first chassis. Thus, when an external force is applied to the connector, large bending stress can be prevented from acting on the circuit board, and accordingly, damage or the like to a conductive pattern and soldered portions is unlikely to be caused. Furthermore, the circuit board is positioned and held in the housing. Thus, when the electronic circuit unit is used as an on-vehicle device, the circuit board can be easily prevented from rattling.

DETAILED DESCRIPTION OF THE PREFERRED EMBODIMENTS

Figure 1:
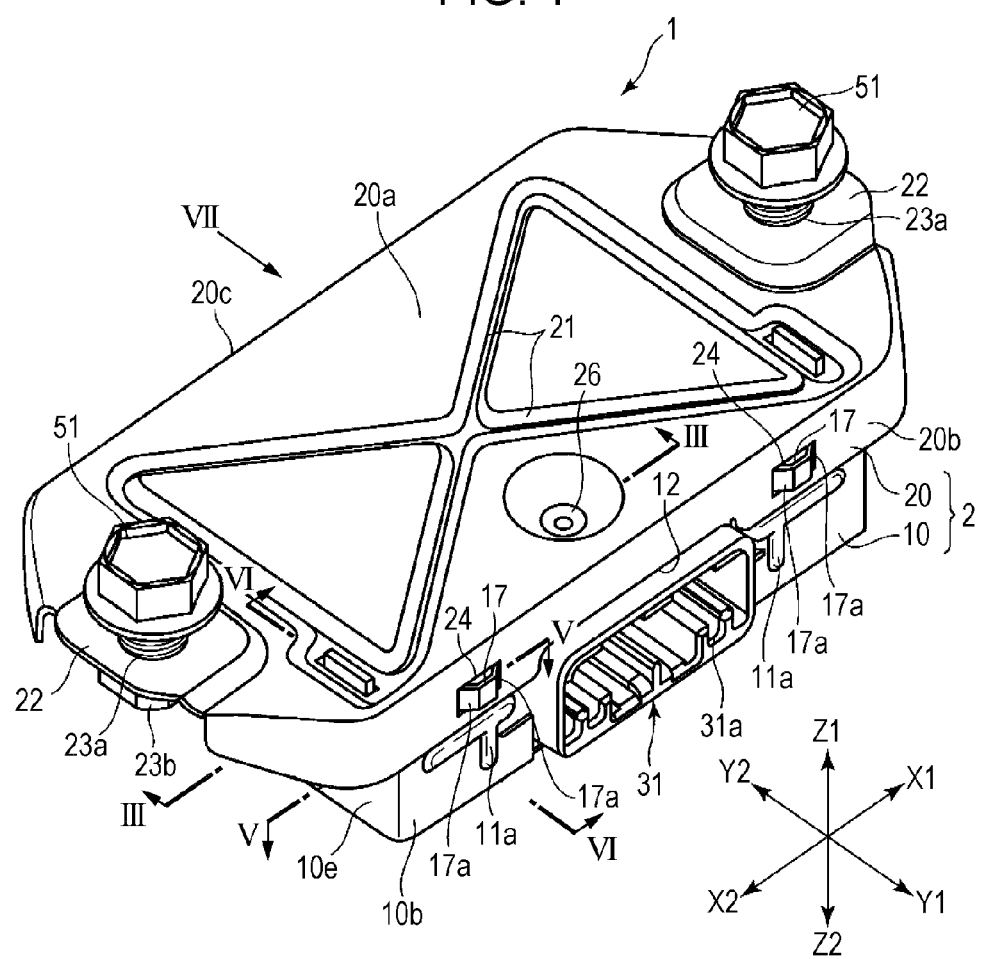
FIG. 1 is an external perspective view of an electronic circuit unit according to an embodiment of the present invention.

FIG. 1 illustrates an electronic circuit unit 1 used as an on-vehicle electronic device such as an active noise canceller.

In the electronic circuit unit 1, a Y1 direction is the forward direction, a Y2 direction is the rearward direction, an X1 direction is the rightward direction, an X2 direction is the leftward direction, a Z1 direction is the upward direction, and a Z2 direction is the downward direction.

A First Chassis and a Circuit Board

The electronic circuit unit 1 includes a housing 2. The housing 2 includes a first chassis 10 and a second chassis 20 that are combined with each other. The first chassis 10 and the second chassis 20 are formed by pressing a metal sheet such as a rolled steel sheet.

Figure 2:
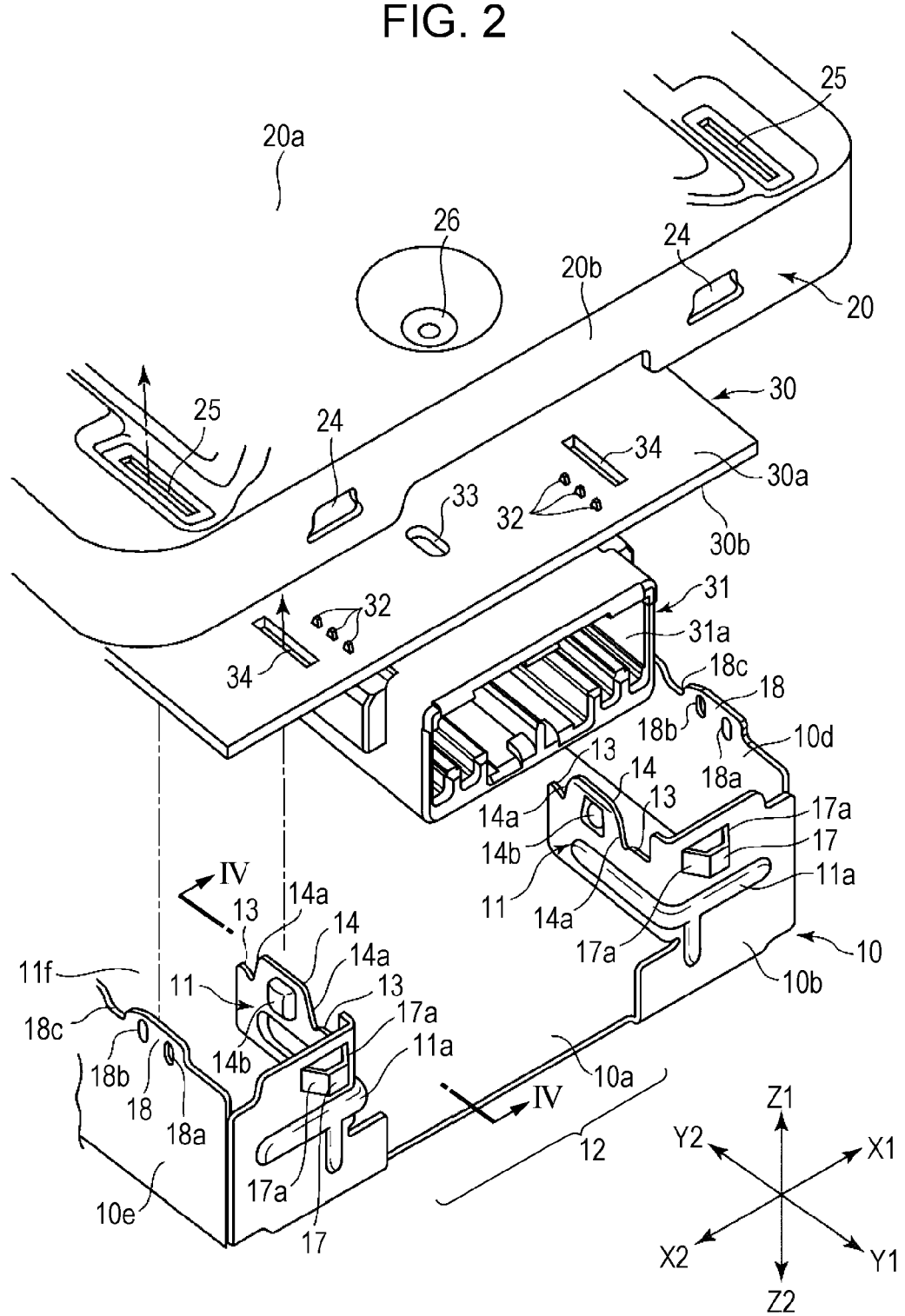
FIG. 2 is an exploded perspective view of part of the electronic circuit unit illustrated in FIG. 1.

A circuit board 30 is housed in the housing 2. A connector 31 is secured to the circuit board 30. As illustrated in FIG. 2, the connector 31 is provided on a lower surface 30b of the circuit board 30 with terminals 32 of the connector 31 inserted into the circuit board 30 from below. A conductive pattern formed on an upper surface 30a of the circuit board 30 and the terminals 32 are secured to one another by solder.

The connector 31 has a fitting opening 31a. The fitting opening 31a has a rectangular shape extending in the left-right direction (X direction) that is the longitudinal direction of the fitting opening 31a. The fitting opening 31a opens at the front (in the Y1 direction).

Figure 7:
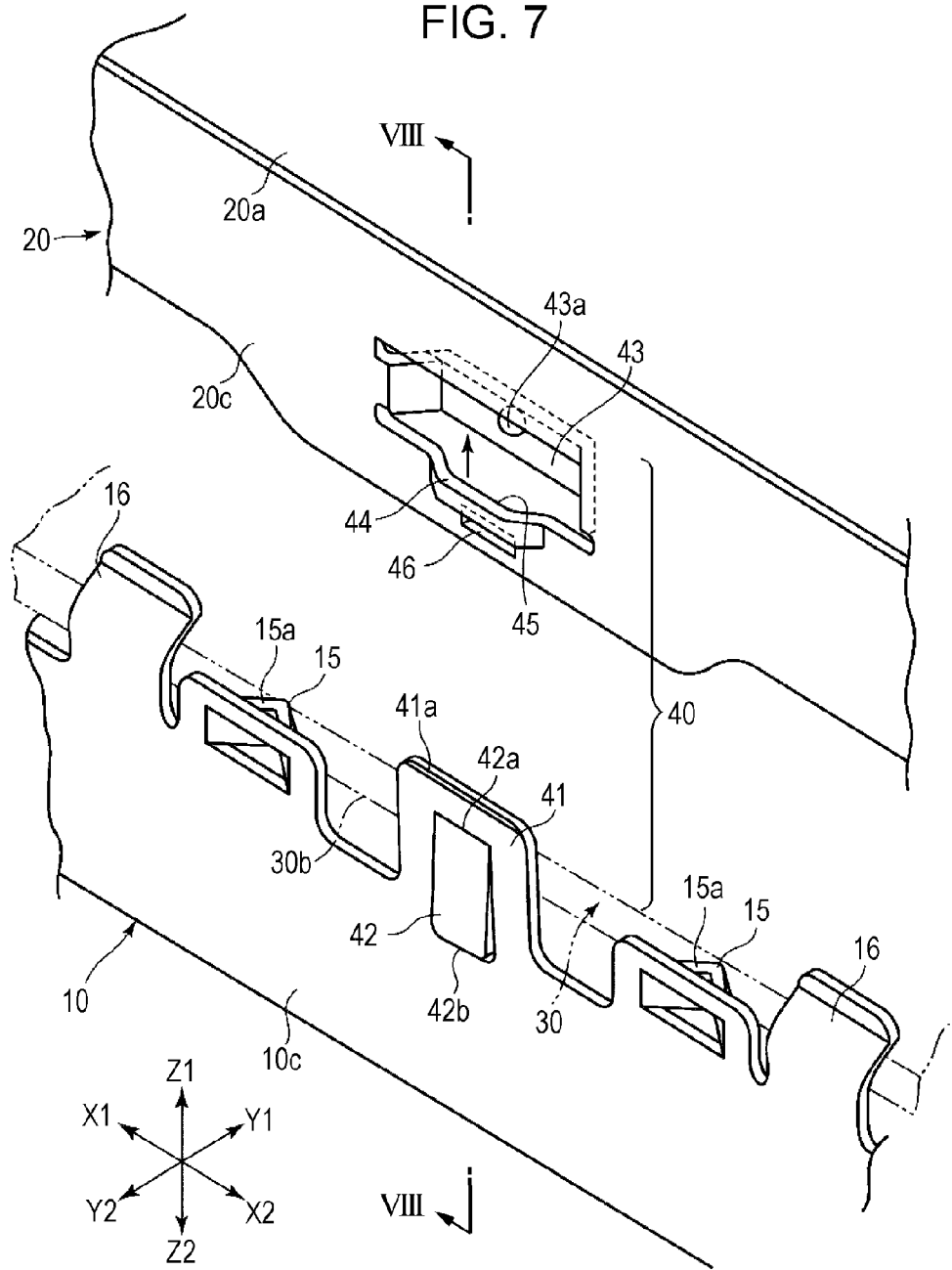
FIG. 7 is an exploded perspective view of part of the electronic circuit unit illustrated in FIG. 1 seen from the rear side in an arrow VII direction of FIG. 1.

The first chassis 10 has a bottom plate portion 10a, a front side plate portion 10b, a right side plate portion 10d, and a left side plate portion 10e as illustrated in FIG. 2, and a rear side plate portion 10c as illustrated in FIG. 7. The front side plate portion 10b, the rear side plate portion 10c, the right side plate portion 10d, and the left side plate portion 10e are substantially perpendicularly bent upward from the bottom plate portion 10a. The first chassis 10 has a cubic box shape having an opening 11f on the upper side (Z1 side).

As illustrated in FIG. 2, support pieces 11 are provided at a front portion of the first chassis 10. The support pieces 11 are spaced apart from each other in the left-right direction (X1-X2 direction). The support pieces 11 are each formed by bending a metal sheet that forms the front side plate portion 10b toward the inside of the first chassis 10. Two support pieces 11 face each other and are parallel to each other. An opening (connector receiving recessed portion) 12 that opens to the front (Y1 direction) is formed between two support pieces 11.

As illustrated in FIG. 2, the support pieces 11 are each bent at a substantially right angle from the front side plate portion 10b. Ribs 11a are continuously formed from the front side plate portion 10b to the support pieces 11. The ribs 11a are projections at middle portions of the front side plate portion 10b and the support pieces 11 in the up-down direction. These ribs 11a reinforce the front side plate portion 10b and the support pieces 11.

Figure 4:
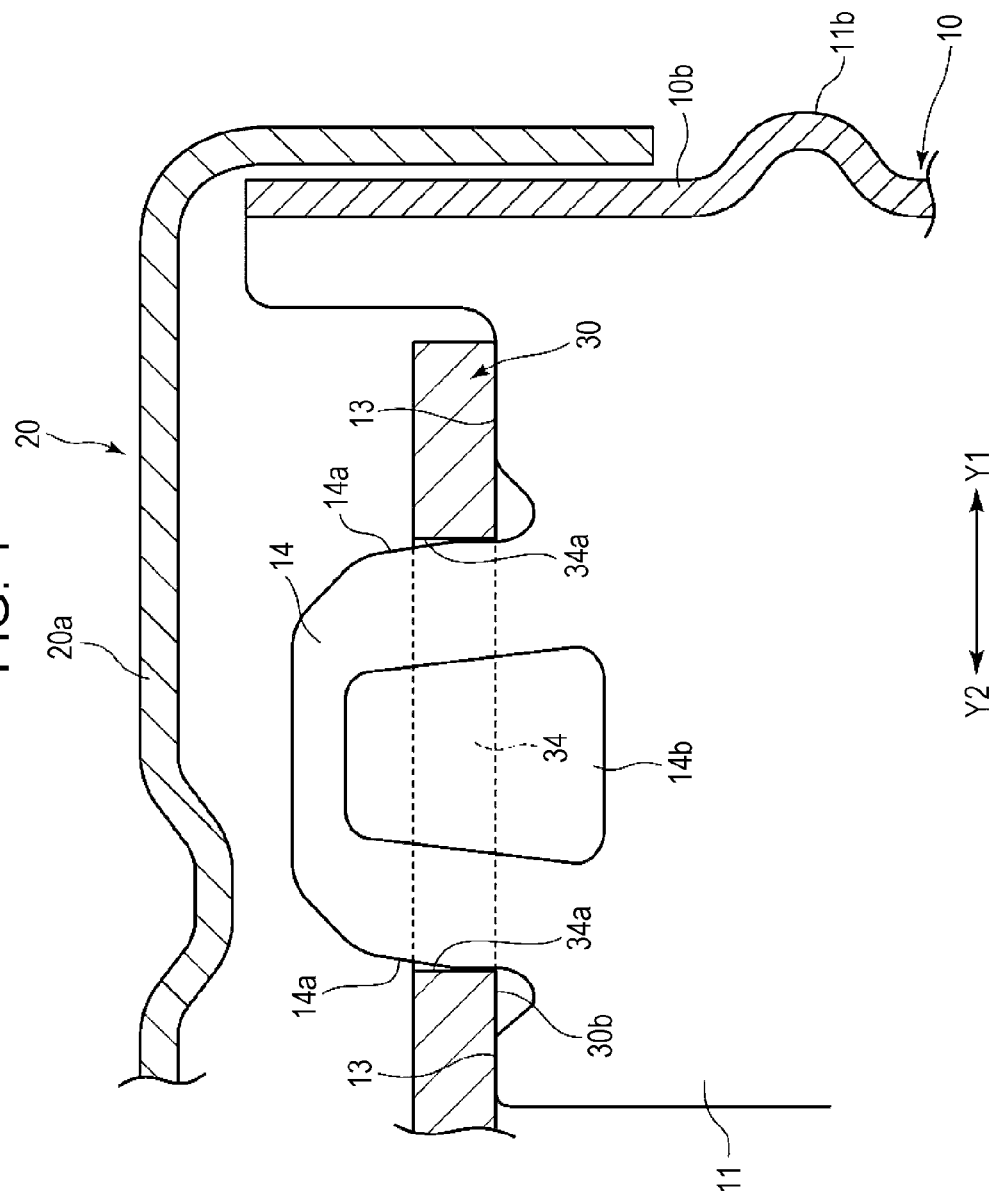
FIG. 4 is a sectional view of an assembled state of part of the electronic circuit unit illustrated in FIG. 2 taken along line IV-IV of FIG. 2.

As illustrated in FIG. 2, receiving portions 13 that face upward (the opening 11f, in the Z1 direction) are formed at an upper side of each of the support pieces 11. A support projection 14, which is directed upward (toward the opening 11f), is provided between the receiving portions 13. The receiving portions 13 are integrally formed with the respective support pieces 11. One of the support projections 14 on the right side (X1 side) has a deformed portion 14b that projects rightward, and the other support projection 14 on the left side (X2 side) has another deformed portion 14b that projects leftward. FIG. 4 illustrates the support projection 14 on the left side. As illustrated in FIG. 4, the support projection 14 has edge portions 14a that extend in the front-rear direction (Y1-Y2 direction) of the support projection 14. The edge portions 14a have respective inclined portions. The inclined portions extend upward (Z1 direction) as they extend close to each other.

As illustrated in FIG. 2, the circuit board 30 has a pair of support holes 34 that open at positions separated from an edge portion of the circuit board 30. The support holes 34 are spaced apart from each other in the left-right direction (X1-X2 direction). Each of the support holes 34 is a long hole elongated in the front-rear direction (Y1-Y2 direction).

As illustrated in FIG. 7, support projections 15 that project forward (Y1 direction) are formed in the rear side plate portion 10c of the first chassis 10. A pair of the support projections 15 are provided so as to be spaced apart from each other in the left-right direction (X1-X2 direction). Receiving portions 15a are formed in the support projections 15. The distance between an upper surface of the bottom plate portion 10a and the receiving portions 15a of the first chassis 10 in the up-down direction matches the distance between the upper surface of the bottom plate portion 10a and the receiving portions 13 of the support pieces 11 illustrated in FIGS. 2 and 3 in the up-down direction.

Pressing pieces 16 are formed further to the left and right sides than the support projections 15 in the rear side plate portion 10c of the first chassis 10. The pressing pieces 16 are spaced apart from each other in the left-right direction (X1-X2 direction) and inclined toward an inner space of the first chassis 10.

The circuit board 30 is provided at a portion of the first chassis 10 in a region from the opening 11f to the inside with the connector 31 secured to the lower surface 30b facing downward. As illustrated in FIG. 1, the connector 31 is housed in the inner space of the first chassis 10, and a tip end portion of the connector 31 is housed inside the opening 12 between the pair of support pieces 11. Also as illustrated in FIG. 1, the fitting opening 31a of the connector 31 is exposed from the front side plate portion 10b and directed forward.

When the circuit board 30 is attached to the first chassis 10, the support projections 14 integrally formed with the support pieces 11 are inserted into the support holes 34 opening on both the left and right sides of the connector 31. The circuit board 30 is pushed until the lower surface 30b is brought into contact with the receiving portions 13 of the support pieces 11. By the contact of the lower surface 30b with the receiving portions 13, the height from the bottom plate portion 10a of the first chassis 10 to the lower surface 30b of the circuit board 30 is determined.

Figure 5:
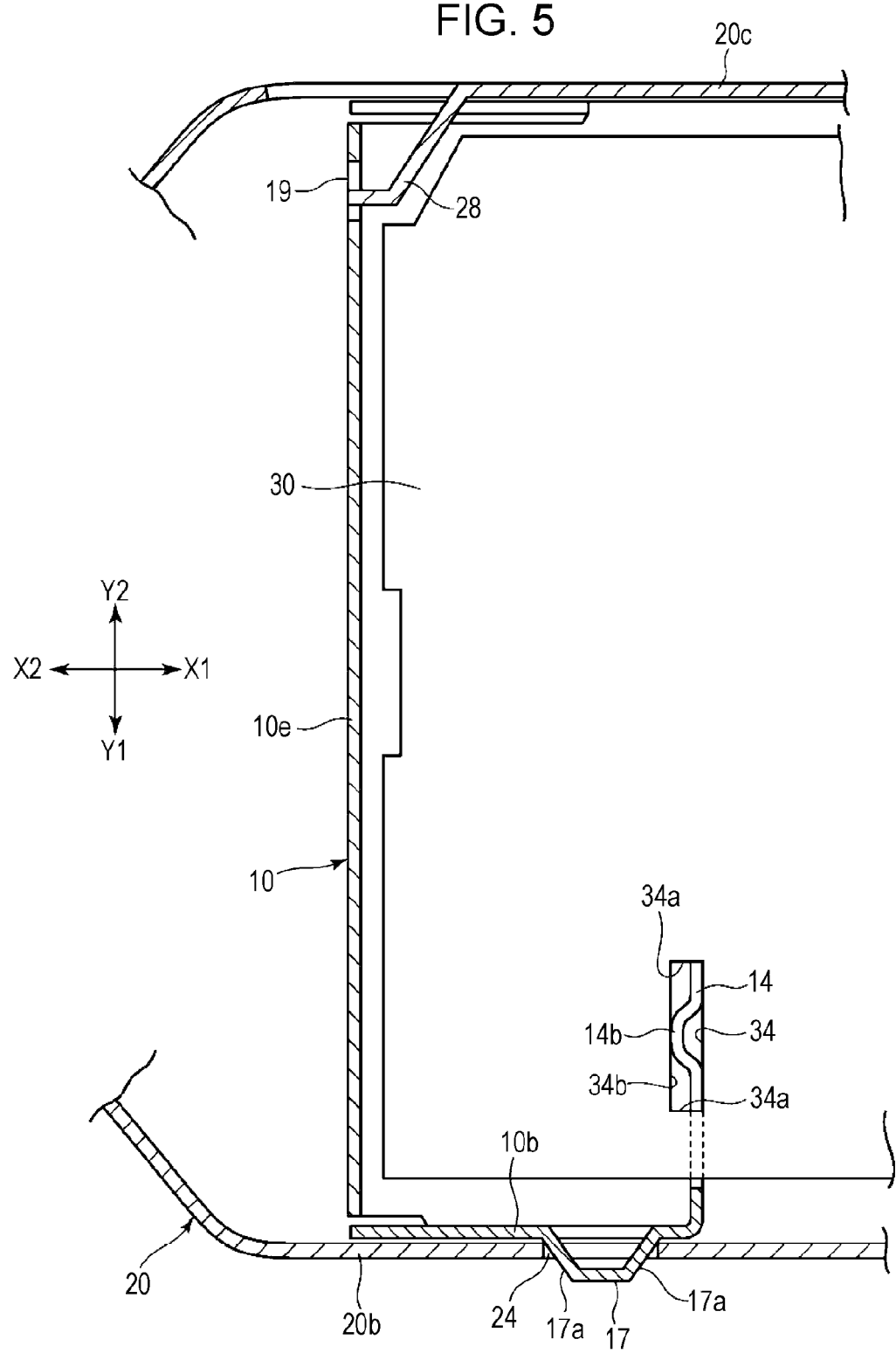
FIG. 5 is a sectional plan view of the electronic circuit unit illustrated in FIG. 1 including a part taken along line V-V of FIG. 1.

At this time, as illustrated in FIG. 4, front and rear inner edges 34a of each of the support holes 34 are guided by the inclined portions formed in the front and rear edge portions 14a of a corresponding one of the support projections 14, and when the lower surface 30b is brought into contact with the receiving portions 13, the edge portions 14a of the support projection 14 are brought into contact or pressure contact with the inner edges 34a of the support hole 34 without clearance. Thus, the circuit board 30 is positioned relative to the first chassis 10 without a movement in the front-rear direction. Furthermore, as illustrated in FIGS. 4 and 5, the deformed portion 14b of one of the support projections 14 formed in the left side is brought into contact or pressure contact with a left (X2 side) inner edge 34b of a corresponding one of the support hole 34 without clearance. Also, the edge portions 14a and the deformed portion 14b of the other support projection 14 on the right side are similarly brought into contact with the inner edges 34a and 34b of a corresponding one of the support hole 34 without clearance.

By fitting the support projections 14 into the support holes 34, the front portion of the circuit board 30 is held inside the first chassis 10 without movements in the left-right and front-rear directions. Furthermore, fitting portions of the support projections 14 with the support holes 34 are disposed in areas on both sides of the connector 31. Thus, when the support projections 14 are fitted into the support holes 34 without clearance, the circuit board 30 is firmly supported near the connector 31.

Figure 8:
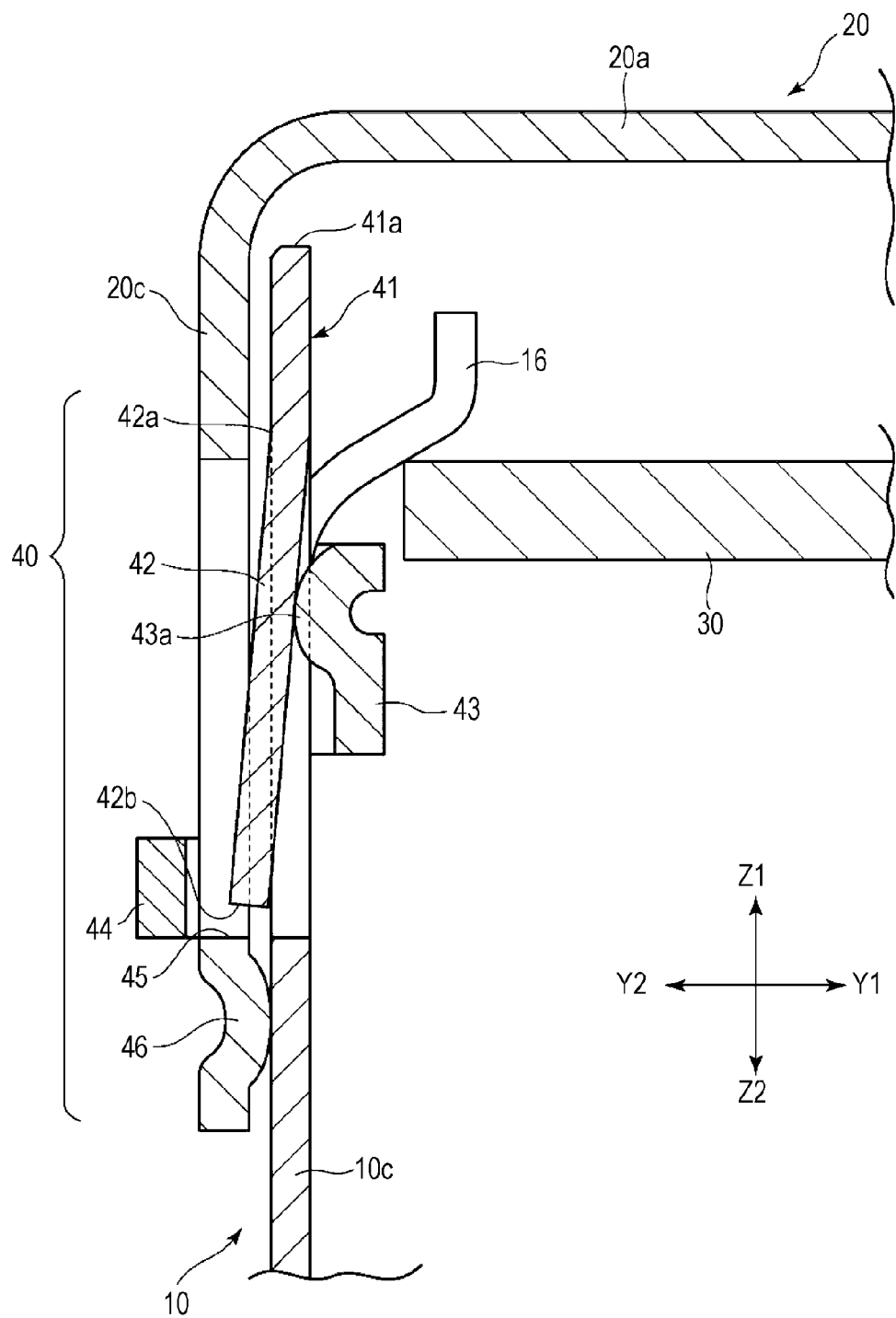
FIG. 8 is a sectional view of an assembled state of part of the electronic circuit unit illustrated in FIG. 7 taken along line VIII-VIII of FIG. 7.

As illustrated in FIG. 7, the lower surface 30b of the circuit board 30 is supported by the upward-facing receiving portions 15a of the support projections 15 in a rear portion of the first chassis 10. Furthermore, as illustrated in FIG. 8, an upper edge of a rear end portion of the circuit board 30 is in contact with an inner surface of the pressing pieces 16. Since the rear end portion of the circuit board 30 is pinched between the receiving portions 15a and the pressing pieces 16 in the up-down direction, a rear portion of the circuit board 30 can be prevented from being moved in the housing 2 when external vibration is applied.

Assembly of the First Chassis and the Second Chassis

As illustrated in FIGS. 1 and 2, the second chassis 20 includes a ceiling plate 20a, a front side plate 20b, and a rear side plate 20c. The front side plate 20b is bent downward in a front portion of the ceiling plate 20a. The rear side plate 20c is bent downward in a rear portion of the ceiling plate 20a. The ceiling plate 20a has reinforcing ribs 21. The reinforcing ribs 21, which project toward the first chassis 10, intersect each other.

The ceiling plate 20a has attachment portions 22 on its left and right side portions. When the second chassis 20 is stacked on the opening 11f of the first chassis 10, the attachment portions 22 project to the outside from the first chassis 10 on both sides in the left-right direction (X1-X2 direction). The attachment portions 22 have respective holes for a screw 23a. Nuts 23b, which communicate with the respective holes for a screw 23a, are secured to a lower surface of the respective attachment portions 22. When attaching to, for example, a vehicle the housing 2 formed by combining the first chassis 10 and the second chassis 20 with each other, bolts 51 are inserted into securing holes formed in the frame of a vehicle body or the like, and tip portions of the bolts 51 are screwed into the nuts 23b through the hole for a screw 23a. Thus, the housing 2 is secured to the frame of the vehicle body or the like.

As illustrated in FIG. 2, front positioning projections 17 are provided in the front side plate portion 10b of the first chassis 10. The front positioning projections 17 project forward (Y1 direction) on both the left and right sides of the opening 12. A pair of front positioning holes 24 open in the front side plate 20b of the second chassis 20 such that the front positioning holes 24 are spaced apart from each other in the left-right direction. As illustrated in FIGS. 1 and 5, when the second chassis 20 is stacked on the first chassis 10 so as to cover the opening 11f of the first chassis 10, the front positioning projections 17 are fitted into the respective front positioning holes 24.

As illustrated in FIGS. 7 and 8, a securing mechanism portion 40 is provided between the rear side plate portion 10c of the first chassis 10 and the rear side plate 20c of the second chassis 20. An insert portion 41, which projects upward, of the securing mechanism portion 40 is integrally formed with the rear side plate portion 10c of the first chassis 10. An engagement piece 42 is integrally formed with the insert portion 41. The engagement piece 42 is bent at an upper bent portion 42a so as to be separated from the insert portion 41. A lower edge portion 42b of the engagement piece 42 projects further to the rear side (Y2 direction) than an outer surface of the insert portion 41.

An inner facing portion 43 of the securing mechanism portion 40 is formed in the rear side plate 20c of the second chassis 20. The inner facing portion 43 is bent to the inside of the second chassis 20. A pressing projection 43a that projects rearward (in the Y2 direction) is integrally formed with the inner facing portion 43 at a central portion of the inner facing portion 43. Part of the rear side plate 20c is deformed so as to project outward, thereby forming an outer facing portion 44 below the inner facing portion 43. As illustrated in FIG. 8, a step portion is formed on an inner lower side of the outer facing portion 44. This step portion serves as a stopper portion 45. Another part of the rear side plate 20c is deformed so as to project forward (in the Y1 direction), thereby forming a guide projection 46 below the stopper portion 45.

When the second chassis 20 is attached to the first chassis 10, the rear side plate 20c of the second chassis 20 is superposed on the rear side plate portion 10c of the first chassis 10 on the outside of the first chassis 10 as illustrated in FIG. 8. At this time, the insert portion 41 of the first chassis 10 passes through a part that is inside the guide projection 46 and outside the inner facing portion 43, and an upper end 41a of the insert portion 41 is inserted so as to reach an inner upper portion of the rear side plate 20c. At this time, the engagement piece 42 formed in the insert portion 41 is pressed rearward (in the Y2 direction) by the pressing projection 43a provided in the inner facing portion 43. The engagement piece 42 is elastically deformed about the bent portion 42a, so that the lower edge portion 42b faces the stopper portion 45 formed in the rear side plate 20c of the second chassis 20.

As a result, the rear side plate 20c of the second chassis 20 is not easily removed from the rear side plate portion 10c of the first chassis 10.

As illustrated in FIG. 1, the second chassis 20 is secured to the first chassis 10 without fastening screws. The second chassis 20 is secured to the first chassis 10 by fitting the front positioning projections 17 formed in the front side plate portion 10b of the first chassis 10 into the front positioning holes 24 formed in the front side plate 20b of the second chassis 20 and setting the rear side plate portion 10c and the rear side plate 20c in a projection and recess fitting state in the securing mechanism portion 40. The dimensions of the front positioning projections 17 in the up-down direction are substantially coincident with the dimensions of the front positioning holes 24 in the up-down direction. Thus, by fitting the front positioning projections 17 into the respective front positioning holes 24, the front side plate 20b of the second chassis 20 is positioned relative to the front side plate portion 10b of the first chassis 10 without a movement in the up-down direction.

Figure 3:
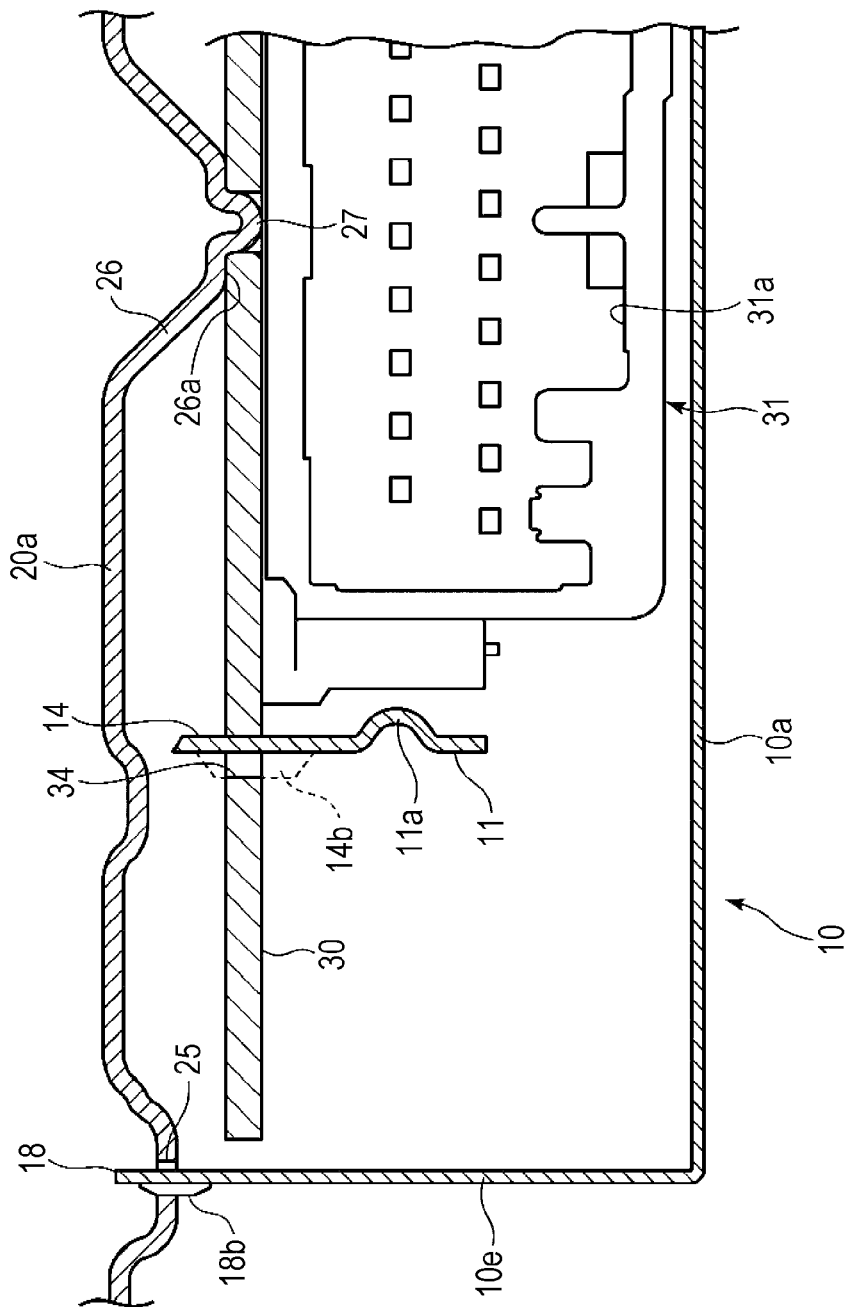
FIG. 3 is a longitudinal sectional view of the electronic circuit unit illustrated in FIG. 1 taken along line III-III of FIG. 1.

As illustrated in FIG. 2, an upwardly projecting positioning projection 18 is integrally formed with each of the left side plate portion 10e and the right side plate portion 10d of the first chassis 10. A pair of positioning holes 25 open in the ceiling plate 20a of the second chassis 20. The positioning holes 25 are long holes elongated in the front-rear direction. The positioning projections 18 have respective inner projections 18a and respective outer projections 18b. The inner projections 18a project toward the inner space of the first chassis 10. The outer projections 18b outwardly project respectively on the left side and on the right side of the first chassis 10. As illustrated in FIG. 3, when the second chassis 20 is attached to the first chassis 10, each of the positioning projections 18 is inserted into a corresponding one of the positioning holes 25, and the inner projection 18a and the outer projection 18b formed in the positioning projection 18 are brought into contact or pressure contact with inner edge portions of the positioning hole 25 without clearance. Thus, the second chassis 20 is positioned relative to the first chassis 10 without a movement in the left-right direction (X1-X2 direction).

Figure 6:
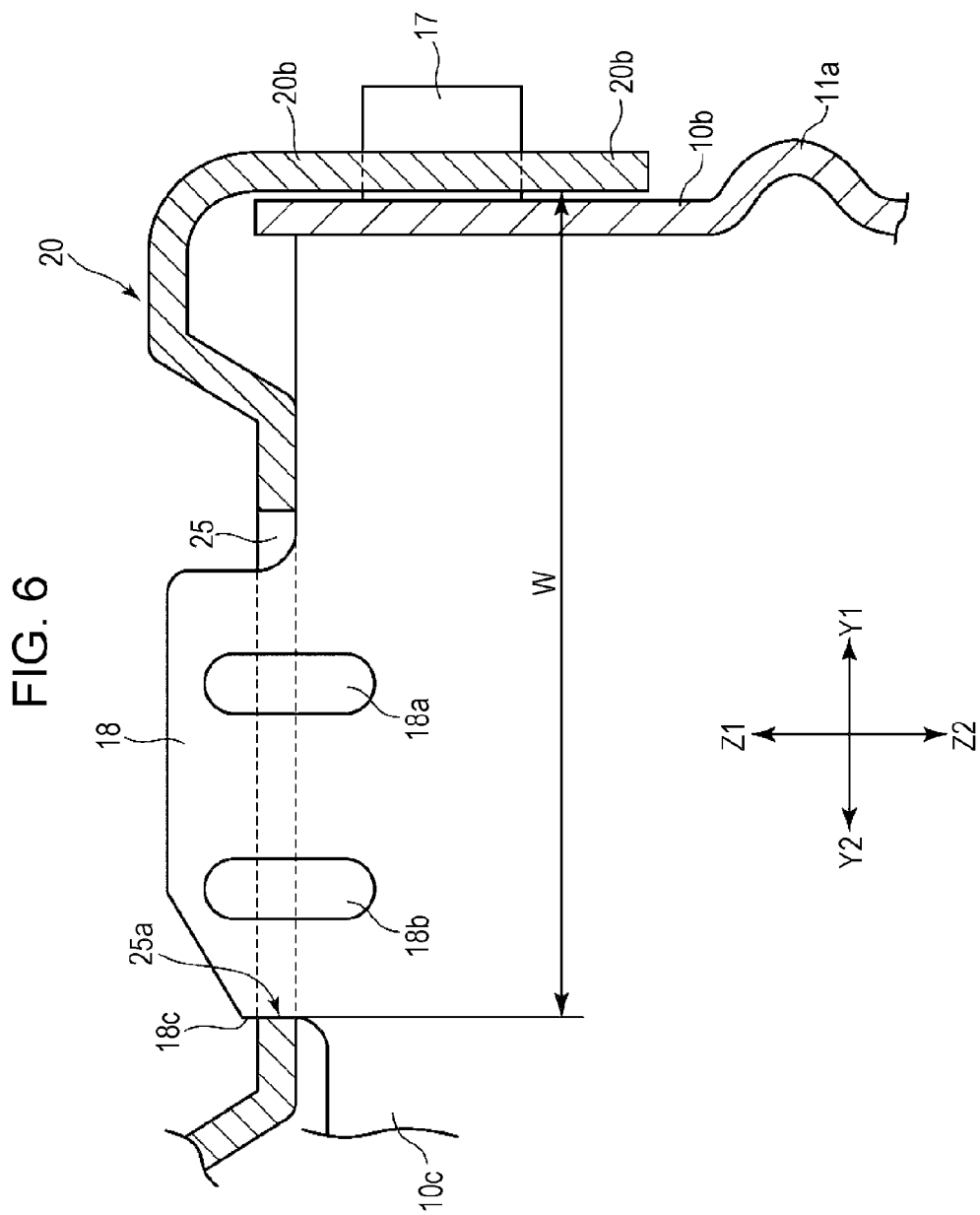
FIG. 6 is a sectional view of part of the electronic circuit unit illustrated in FIG. 1 taken along line VI-VI of FIG. 1.

Furthermore, as illustrated in FIG. 6, the depth dimension W from an inner surface of the front side plate 20b of the second chassis 20 to rear edge portions 18c is determined so that rear edge portions 18c of the positioning projections 18 are brought into contact with or pressure contact with rear inner edges 25a of the positioning holes 25 without clearance, while inner edge portions of the front positioning holes 24 are in contact with left and right inclined surfaces 17a of the front positioning projections 17 as illustrated in FIG. 5. Due to these dimensional relationships, the second chassis 20 is positioned relative to the first chassis 10 without a movement in the front-rear direction (Y1-Y2 direction).

Furthermore, as illustrated in FIG. 5, positioning pieces 28 are provided extending from the rear side plate 20c toward an inner space of the second chassis 20. The positioning pieces 28 are spaced apart from each other in the left-right direction (X1-X2 direction). Tip portions of the positioning pieces 28 are fitted into rear positioning holes 19 formed in the left side plate portion 10e and the right side plate portion 10d of the first chassis 10. With this fitting structure, the second chassis 20 is positioned relative to the first chassis 10 in a rear portion of the housing 2 without the movements in the left-right direction (X1-X2 direction) and the up-down direction (Z1-Z2 direction).

As illustrated in FIGS. 2 and 3, a pressing projection 26 is formed in the ceiling plate 20a of the second chassis 20. The pressing projection 26 projects downward and has a pressing contact surface 26a at its lower end portion. A fitting projection 27 is integrally formed with the pressing projection 26 so as to extend downward from the pressing contact surface 26a. The circuit board 30 has a hole 33 opening at a position facing an upper side of the connector 31. When the second chassis 20 is attached to the first chassis 10, the fitting projection 27 is fitted into the hole 33 so as to position the second chassis 20 and the circuit board 30 relative to each other in the left-right direction (X1-X2 direction). Furthermore, the circuit board 30, the lower surface 30b of which is supported by the receiving portions 13 formed in the support pieces 11 and the upper surface 30a of which is supported by the pressing contact surface 26a, is firmly held in the housing 2.

Operation Performed by the Embodiment

In the electronic circuit unit 1 according to the embodiment, the second chassis 20 can be attached to the first chassis 10 by the securing mechanism portion 40 illustrated in FIG. 7 without fastening screws. As illustrated in FIG. 8, the lower edge portion 42b of the engagement piece 42 of the first chassis 10 faces the stopper portion 45 of the second chassis 20 in the securing mechanism portion 40. Thus, the second chassis 20 cannot be easily removed from the first chassis 10. According to the present invention, the engagement piece 42 of the insert portion 41 may be provided in the rear side plate 20c of the second chassis 20 and the inner facing portion 43, the outer facing portion 44, the stopper portion 45, and the like may be provided in the rear side plate portion 10c of the first chassis 10.

A fitting mechanism of the front positioning projections 17 and the front positioning holes 24, a fitting mechanism of the positioning projections 18 and the positioning holes 25, and a fitting mechanism of the positioning pieces 28 and the rear positioning holes 19 illustrated in FIG. 5 are provided between the first chassis 10 and the second chassis 20. Thus, the first chassis 10 is positioned relative to the second chassis 20, and movements of the first chassis 10 and the second chassis 20 relative to each other do not occur.

When the circuit board 30 is attached in the first chassis 10 and the second chassis 20, the support projections 14 are fitted into the support holes 34 as illustrated in FIGS. 2 and 4. Also in this state, the rear end portion of the circuit board 30 is held by the receiving portions 15a and the pressing pieces 16 in the rear portion as illustrated in FIG. 7. Thus, the circuit board 30 can be prevented from being moved in the housing 2.

The circuit board 30 has the support holes 34 on both the left and right sides of the connector 31 and the support holes 34 are supported by the support projections 14. Thus, even in the case where a large external force acts on the connector 31 when a plug is fitted into or removed from the connector 31, the connector 31 and the circuit board 30 can be firmly held by the first chassis 10 against this external force. Furthermore, as illustrated in FIG. 3, part of the circuit board 30 facing the connector 31 is pressed by the pressing projection 26 from above, and the fitting projection 27 is fitted into the hole 33. Thus, in the case where an external force is applied to the connector 31, the force that acts on the connector 31 and the circuit board 30 can be received by the receiving portions 13 of the support pieces 11 provided in the first chassis 10 and the pressing projection 26 of the second chassis 20. Thus, it is unlikely that soldered portions and the conductive pattern of the circuit board 30 are damaged by the external force that acts on the connector 31.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. An electronic circuit unit that includes a housing and a circuit board which is housed in the housing and to which a connector is secured,
    wherein the housing includes a first chassis and a second chassis that covers an opening of the first chassis, and the first chassis and the second chassis are each formed of a metal sheet,
    wherein the first chassis includes a plurality of side plate portions defining an interior of the first chassis and has a pair of support pieces formed by inwardly bending the metal sheet that is part of a-one side plate portion and an opening formed between the support pieces that face each other, the support pieces extending inwardly from the one side plate portion into the interior of the first chassis, parallel to other side plate portions,
    wherein the support pieces have respective receiving portions and respective support projections integrally formed with the support pieces, and
    wherein the circuit board has support holes, the circuit board is provided inside the first chassis, the connector is inserted into the opening, the circuit board is supported by the receiving portions, and the support projections are inserted into the support holes.

2. The electronic circuit unit according to claim 1, wherein the support holes are formed in areas on each side of the connector.

3. The electronic circuit unit according to claim 1, wherein, when a direction in which the support pieces extend is defined as a front-rear direction, both edge portions of each of the support projections in the front-rear direction are in contact with a corresponding one of the support holes so as to position the circuit board relative to the first chassis in the front-rear direction.

4. The electronic circuit unit according to claim 1, wherein the support projections have respective deformed portions that project in a plate thickness direction and that are brought into contact with inner edges of the support holes so as to position the circuit board in a left-right direction that is the plate thickness direction.

5. The electronic circuit unit according to claim 1, wherein the second chassis has a pressing projection that faces the first chassis so as to position the circuit board in an up-down direction that is a plate thickness direction of the circuit board by the receiving portions of the support pieces and the pressing projection.

6. The electronic circuit unit according to claim 5, wherein the pressing projection has a fitting projection at a tip end portion thereof, a hole is formed in the circuit board, and the fitting projection is fitted into the hole.

7. The electronic circuit unit according to claim 5, wherein the pressing projection is formed at a position facing the connector.

8. The electronic circuit unit according to claim 1, wherein an area of the second chassis is larger than an area of the opening of the first chassis, a positioning projection is formed in the side plate portion of the first chassis, a positioning hole is formed in the second chassis, and the positioning projection is fitted into the positioning hole so as to position the first chassis and the second chassis relative to each other.

9. The electronic circuit unit according to claim 1, wherein the first chassis and the second chassis are secured to each other only by projection and recess fitting.

10. An electronic circuit unit that includes a housing and a circuit board which is housed in the housing and to which a connector is secured,
    wherein the housing includes a first chassis and a second chassis that covers an opening of the first chassis, and the first chassis and the second chassis are each formed of a metal sheet,
    wherein the first chassis includes a plurality of side plate portions defining an interior of the first chassis and has a pair of support pieces formed by inwardly bending the metal sheet that is part of a-one side plate portion and an opening formed between the support pieces that face each other, the support pieces extending inwardly from the one side plate portion into the interior of the first chassis, parallel to other side plate portions,
    wherein the support pieces have respective receiving portions and respective support projections integrally formed with the support pieces,
    wherein the circuit board has support holes, the circuit board is provided inside the first chassis, the connector is inserted into the opening, the circuit board is supported by the receiving portions, and the support projections are inserted into the support holes,
    wherein the second chassis has a pressing projection that faces the first chassis so as to position the circuit board in an up-down direction that is a plate thickness direction of the circuit board by the receiving portions of the support pieces and the pressing projection, and
    wherein the first chassis and the second chassis are secured to each other only by projection and recess fitting.

11. The electronic circuit unit according to claim 10, wherein the support holes are formed in areas on each side of the connector.

12. The electronic circuit unit according to claim 10, wherein, when a direction in which the support pieces extend is defined as a front-rear direction, both edge portions of each of the support projections in the front-rear direction are in contact with a corresponding one of the support holes so as to position the circuit board relative to the first chassis in the front-rear direction.

13. The electronic circuit unit according to claim 10,
wherein the support projections have respective deformed portions that project in a plate thickness direction and that are brought into contact with inner edges of the support holes so as to position the circuit board in a left-right direction that is the plate thickness direction.

14. The electronic circuit unit according to claim 10,
wherein the pressing projection has a fitting projection at a tip end portion thereof, a hole is formed in the circuit board, and the fitting projection is fitted into the hole.

15. The electronic circuit unit according to claim 10,
wherein the pressing projection is formed at a position facing the connector.

16. The electronic circuit unit according to claim 10,
wherein an area of the second chassis is larger than an area of the opening of the first chassis, a positioning projection is formed in the side plate portion of the first chassis, a positioning hole is formed in the second chassis, and the positioning projection is fitted into the positioning hole so as to position the first chassis and the second chassis relative to each other.

17. An electronic circuit unit that includes a housing and a circuit board which is housed in the housing and to which a connector is secured,
wherein the housing includes a first chassis and a second chassis that covers an opening of the first chassis, and the first chassis and the second chassis are each formed of a metal sheet,
wherein the first chassis has a pair of support pieces formed by inwardly bending the metal sheet that is part of a side plate portion and an opening formed between the support pieces that face each other,
wherein the support pieces have respective receiving portions and respective support projections integrally formed with the support pieces,
wherein the circuit board has support holes, the circuit board is provided inside the first chassis, the connector is inserted into the opening, the circuit board is supported by the receiving portions, and the support projections are inserted into the support holes,
wherein an area of the second chassis is larger than an area of the opening of the first chassis, a positioning projection is formed in the side plate portion of the first chassis, a positioning hole is formed in the second chassis, and the positioning projection is fitted into the positioning hole so as to position the first chassis and the second chassis relative to each other, and
wherein the first chassis and the second chassis are secured to each other only by projection and recess fitting.

18. The electronic circuit unit according to claim 17,
wherein, when a direction in which the support pieces extend is defined as a front-rear direction, both edge portions of each of the support projections in the front-rear direction are in contact with a corresponding one of the support holes so as to position the circuit board relative to the first chassis in the front-rear direction.

19. The electronic circuit unit according to claim 17,
wherein the second chassis has a pressing projection that faces the first chassis so as to position the circuit board in an up-down direction that is a plate thickness direction of the circuit board by the receiving portions of the support pieces and the pressing projection.

20. The electronic circuit unit according to claim 19,
wherein the pressing projection has a fitting projection at a tip end portion thereof, a hole is formed in the circuit board, and the fitting projection is fitted into the hole.

* * * * *